(12) United States Patent
Hamanaka et al.

(10) Patent No.: US 12,464,959 B2
(45) Date of Patent: Nov. 4, 2025

(54) MAGNETIZATION ROTATIONAL ELEMENT, MAGNETORESISTIVE EFFECT ELEMENT, AND MAGNETIC MEMORY

(71) Applicant: TDK CORPORATION, Tokyo (JP)

(72) Inventors: Kosuke Hamanaka, Tokyo (JP); Yohei Shiokawa, Tokyo (JP); Minoru Sanuki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 445 days.

(21) Appl. No.: 17/927,469

(22) PCT Filed: Nov. 15, 2021

(86) PCT No.: PCT/JP2021/041886
§ 371 (c)(1),
(2) Date: Nov. 23, 2022

(87) PCT Pub. No.: WO2022/102770
PCT Pub. Date: May 19, 2022

(65) Prior Publication Data
US 2023/0180629 A1 Jun. 8, 2023

(30) Foreign Application Priority Data
Nov. 16, 2020 (WO) .................. PCT/JP2020/042602

(51) Int. Cl.
*H10N 52/85* (2023.01)
*H10B 61/00* (2023.01)
*H10N 50/85* (2023.01)

(52) U.S. Cl.
CPC ............. *H10N 52/85* (2023.02); *H10B 61/22* (2023.02); *H10N 50/85* (2023.02)

(58) Field of Classification Search
CPC ............................... H10D 48/40; H01F 10/329
See application file for complete search history.

(56) References Cited

U.S. PATENT DOCUMENTS

| 8,350,347 B2 | 1/2013 | Gaudin et al. |
| 2012/0075922 A1 | 3/2012 | Yamada et al. |

(Continued)

FOREIGN PATENT DOCUMENTS

| JP | 2007-096032 A | 4/2007 |
| JP | 2017-059594 A | 3/2017 |

(Continued)

OTHER PUBLICATIONS

Y. K. Kato et al., "Observation of the Spin Hall Effect in Semiconductors", Science, 306, pp. 1910-1913, (2004).

(Continued)

*Primary Examiner* — Shih Tsun A Chou
(74) *Attorney, Agent, or Firm* — Oliff PLC

(57) ABSTRACT

This magnetization rotational element includes a spin-orbit torque wiring, and a first ferromagnetic layer in contact with the spin-orbit torque wiring, in which the spin-orbit torque wiring includes a first layer, a second layer, and a third layer in order from a side closer to the first ferromagnetic layer, and a coefficient of linear expansion of a material forming the second layer is between a coefficient of linear expansion of a material forming the first layer and a coefficient of linear expansion of a material forming the third layer.

20 Claims, 11 Drawing Sheets

(56) References Cited

U.S. PATENT DOCUMENTS

| | | | |
|---|---|---|---|
| 2015/0348606 | A1 | 12/2015 | Buhrman et al. |
| 2017/0076769 | A1 | 3/2017 | Shirotori et al. |
| 2017/0178705 | A1 | 6/2017 | Buhrman et al. |
| 2017/0222135 | A1 | 8/2017 | Fukami et al. |
| 2018/0254773 | A1* | 9/2018 | Yoshinari ............ H01F 10/3286 |
| 2019/0057732 | A1 | 2/2019 | Shiokawa et al. |
| 2019/0088859 | A1 | 3/2019 | Shimizu et al. |
| 2019/0131517 | A1 | 5/2019 | Shiokawa et al. |
| 2019/0189516 | A1 | 6/2019 | Sasaki et al. |
| 2019/0355401 | A1 | 11/2019 | Shiokawa |
| 2021/0083175 | A1 | 3/2021 | Suda et al. |
| 2021/0364580 | A1 | 11/2021 | Tsumita et al. |

FOREIGN PATENT DOCUMENTS

| | | |
|---|---|---|
| JP | 6426330 B1 | 11/2018 |
| JP | 2019-057553 A | 4/2019 |
| JP | 2019-068086 A | 4/2019 |
| WO | 2010/134378 A1 | 11/2010 |
| WO | 2016/021468 A1 | 2/2016 |
| WO | 2018/189964 A1 | 10/2018 |
| WO | 2019/045055 A1 | 3/2019 |
| WO | 2019/171715 A1 | 9/2019 |

OTHER PUBLICATIONS

I. M. Miron et al., "Perpendicular switching of a single ferromagnetic layer induced by in-plane current injection", Nature, 476, pp. 189-194, (2011).

L. Liu et al., "Spin torque switching with the giant spin Hall effect of tantalum", Science, 336, 555, 31 pages (2012).

L. Liu et al., "Current-Induced Switching of Perpendicularly Magnetized Magnetic Layers Using Spin Torque from the Spin Hall Effect", Physical Review Letters, 109, pp. 096602-1-096602-5, (2012).

K. S. Lee et al., "Threshold current for switching of a perpendicular magnetic layer induced by spin Hall effect", Applied Physics Letters, 102, 112410, 17 pages, (2013).

K. S. Lee et al., "Thermally activated switching of perpendicular magnet by spin-orbit spin torque", Applied Physics Letters, 104, pp. 072413-1-072413-5, (2014).

S. Fukami et al., "Magnetization switching by spin-orbit torque in an antiferromagnet-ferromagnet bilayer system", Nature Materials, 15, pp. 535-542, (2016).

S. Fukami et al., "A spin-orbit torque switching scheme with collinear magnetic easy axis and current configuration", nature nanotechnology, 6 pages, 2016.

S. Takahashi et al., "Spin injection and detection in magnetic nanostructures", Physical Review B 67, pp. 052409-1-052409-4, (2003).

Y. Seo et al., "Area-Efficient SOT-MRAM With a Schottky Diode", IEEE Electron Device Letters, vol. 37, No. 8, pp. 982-985, 2016.

W. Zhang et al., "Spin Hall Effects in Metallic Antiferromagnets", Physical Review Letters, 113, pp. 196602-1-196602-6, (2014).

Jan. 11, 2022 Search Report issued in International Patent Application No. PCT/JP2021/041886.

* cited by examiner

MAGNETIZATION ROTATIONAL ELEMENT, MAGNETORESISTIVE EFFECT ELEMENT, AND MAGNETIC MEMORY

TECHNICAL FIELD

The present invention relates to a magnetization rotational element, a magnetoresistance effect element, and a magnetic memory. Priority is claimed on PCT Application No. PCT/JP2020/042602 filed in the international phase on Nov. 16, 2020, the content of which is incorporated herein by reference.

BACKGROUND ART

A giant magnetoresistance (GMR) element formed of a multilayer film including a ferromagnetic layer and a nonmagnetic layer, and a tunnel magnetoresistance (TMR) element in which an insulating layer (a tunnel barrier layer, a barrier layer) is used for a nonmagnetic layer are known as magnetoresistance effect elements. The magnetoresistance effect element can be applied to magnetic sensors, high-frequency components, magnetic heads, and magnetic random access memories (MRAMs).

An MRAM is a storage element in which magnetoresistance effect elements are integrated. In an MRAM, data is read and written by utilizing characteristics in which a resistance of a magnetoresistance effect element changes as magnetization directions of two ferromagnetic layers sandwiching a nonmagnetic layer in the magnetoresistance effect element change. The magnetization direction of the ferromagnetic layer is controlled by utilizing, for example, a magnetic field generated by a current. Also, for example, the magnetization direction of the ferromagnetic layer is controlled by utilizing a spin transfer torque (STT) generated when a current is caused to flow in a lamination direction of the magnetoresistance effect element.

When a magnetization direction of the ferromagnetic layer is rewritten by utilizing the STT, a current is caused to flow in a lamination direction of the magnetoresistance effect element. A write current causes deterioration in characteristics of the magnetoresistance effect element.

In recent years, attention has been focused on a method that does not require a current to be caused to flow in a lamination direction of the magnetoresistance effect element during writing. One of the methods is a write method utilizing a spin-orbit torque (SOT). An SOT is induced by a spin current generated by a spin-orbit interaction or by a Rashba effect at an interface between different materials. A current for inducing the SOT in a magnetoresistance effect element flows in a direction intersecting a lamination direction of the magnetoresistance effect element. That is, there is no need to cause a current to flow in a lamination direction of the magnetoresistance effect element, and thus a prolonged life of the magnetoresistance effect element is expected.

Patent Document 1 describes that, in a magnetoresistance effect element that utilizes a spin-orbit torque, magnetization reversal of a ferromagnetic layer is facilitated by using a spin-orbit torque wiring as a laminated film to increase a laminated interface.

CITATION LIST

Patent Document

[Patent Document 1]
Japanese Patent No. 6426330

SUMMARY OF INVENTION

Technical Problem

A spin-orbit torque wiring tends to generate heat when a write current is applied. When the spin-orbit torque wiring generates heat, a thermal stress is applied to the spin-orbit torque wiring. When the spin-orbit torque wiring is made of a plurality of layers, a strain may be caused in the spin-orbit torque wiring by a difference in coefficient of expansion between each layer. The strain causes cracks and peeling between layers of the laminated film.

The present invention has been made in view of the above circumstances, and an object thereof is to provide a magnetization rotational element, a magnetoresistance effect element, and a magnetic memory capable of suppressing deterioration of a spin-orbit torque wiring due to a strain.

Solution to Problem

The present invention provides the following methods to solve the above-described problems.

(1) A magnetization rotational element according to a first aspect includes a spin-orbit torque wiring, and a first ferromagnetic layer in contact with the spin-orbit torque wiring, in which the spin-orbit torque wiring includes a first layer, a second layer, and a third layer in order from a side closer to the first ferromagnetic layer, and a coefficient of linear expansion of a material forming the second layer is between a coefficient of linear expansion of a material forming the first layer and a coefficient of linear expansion of a material forming the third layer.

(2) In the magnetization rotational element according to the above-described aspect, the first layer may contain a first element as a main element, the second layer may contain a second element different from the first element as a main element, the third layer may contain a third element different from the first element and the second element as a main element, and a coefficient of linear expansion of the second element may be between a coefficient of linear expansion of the first element and a coefficient of linear expansion of the third element.

(3) In the magnetization rotational element according to the above-described aspect, the first layer may contain a first element as a main element, the second layer may contain a second element different from the first element as a main element, the third layer may contain a third element different from the first element and the second element as a main element, the first element and the third element may each be any one of Au, Bi, Hf, Ir, Mo, Pd, Pt, Rh, Ru, Ta, W, Ag, Al, Cu, Ge, and Si, and the second element may be any one of Ag, Au, Bi, Co, Cr, Cu, Fe, Ge, Hf, Ir, Mo, Ni, Pd, Pt, Rh, Ru, and Ta.

(4) In the magnetization rotational element according to the above-described aspect, the first element may be any one of Au, Bi, Hf, Ir, Mo, Pd, Pt, Rh, Ru, Ta, and W, the second element may be any one of Ag, Au, Bi, Co, Cr, Cu, Fe, Ge, Hf, Ir, Mo, Ni, Pd, Pt, Rh, Ru, and Ta, and the third element may be any one of Ag, Al, Cu, Ge, and Si.

(5) In the magnetization rotational element according to the above-described aspect, a perimeter of the first layer may be smaller than perimeters of the second layer and the third layer, and a perimeter of the second layer may be smaller than a perimeter of the third layer.

(6) In the magnetization rotational element according to the above-described aspect, a perimeter of the first layer may be larger than perimeters of the second layer and the third layer, and a perimeter of the second layer may be larger than a perimeter of the third layer.

(7) The magnetization rotational element according to the above-described aspect may further include a fourth layer containing the same material as the second layer, and a fifth layer containing the same material as the first layer or the third layer. The fourth layer is between the fifth layer and the third layer.

(8) In the magnetization rotational element according to the above-described aspect, a film thickness of the second layer may be smaller than film thicknesses of the first layer and the third layer.

(9) In the magnetization rotational element according to the above-described aspect, the second layer may be a continuous film having a plurality of openings or a layer including a plurality of constituent elements scattered in an island shape.

(10) The magnetization rotational element according to the above-described aspect may further include an intermediate layer in contact with the spin-orbit torque wiring, and a conductive layer connected to the spin-orbit torque wiring through the intermediate layer, in which a coefficient of linear expansion of a material forming the intermediate layer may be between a coefficient of linear expansion of a layer in contact with the intermediate layer and a coefficient of linear expansion of the conductive layer.

(11) A magnetoresistance effect element according to a second aspect includes a magnetization rotational element according to the above-described aspect, a nonmagnetic layer in contact with the first ferromagnetic layer of the magnetization rotational element, and a second ferromagnetic layer, together with the first ferromagnetic layer, sandwiching the nonmagnetic layer therebetween.

(12) A magnetic memory according to a third aspect includes a plurality of magnetoresistance effect elements described above.

Advantageous Effects of Invention

The magnetization rotational element, the magnetoresistance effect element, and the magnetic memory according to the present invention can suppress deterioration of a spin-orbit torque wiring due to a strain.

DESCRIPTION OF EMBODIMENTS

Figure 1:
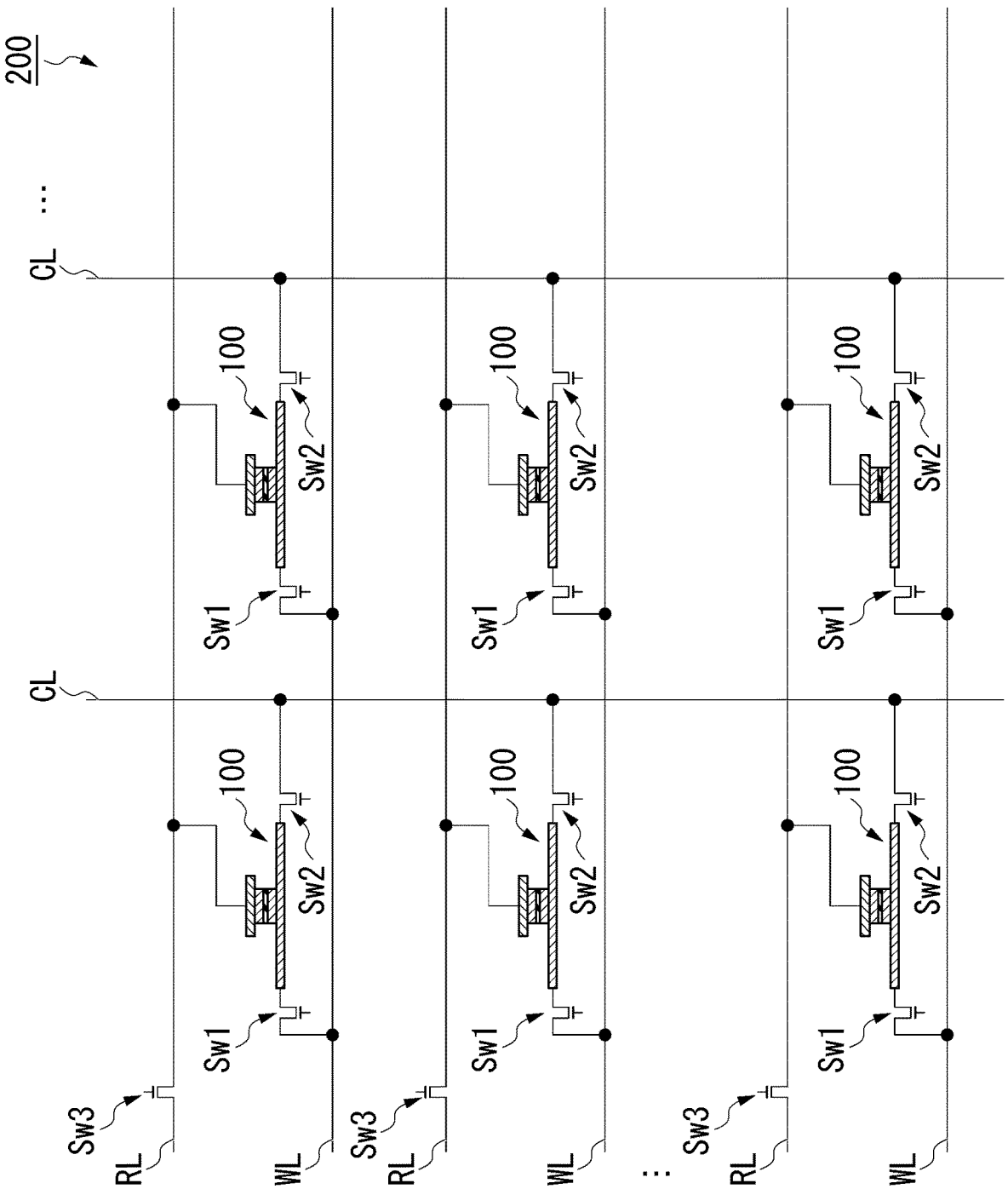
FIG. 1 is a circuit diagram of a magnetic array according to a first embodiment.

Hereinafter, embodiments will be described in detail with reference to the drawings as appropriate. In the drawings used in the following description, there are cases in which characteristic portions are appropriately enlarged for convenience of illustration so that the characteristics can be easily understood, and dimensional proportions of respective constituent elements may be different from actual ones. Materials, dimensions, and the like illustrated in the following description are merely examples, and the present invention is not limited thereto and can be implemented with appropriate modifications within a range in which the effects of the present invention are achieved.

First, directions will be defined. One direction of one surface of a substrate Sub (see FIG. 2) to be described later is defined as an x direction, and a direction perpendicular to the x direction is defined as a y direction. The x direction is, for example, a direction from a first conductive layer 31 toward a second conductive layer 32.

A z direction is a direction perpendicular to the x direction and the y direction. The z direction is an example of a lamination direction in which respective layers are laminated. Hereinafter, a +z direction may be expressed as "upward" and a −z direction may be expressed as "downward." The "upward" and the "downward" may not necessarily coincide with a direction in which gravity is applied.

In this specification, "extending in the x direction" means that, for example, a dimension in the x direction is larger than a minimum dimension of dimensions in the x direction, the y direction, and the z direction. The same applies to cases of extending in other directions. Also, the term "connection" in the present specification is not limited to a case of being physically connected. For example, not only a case in which two layers are physically in contact with each other, but also a case in which two layers are connected with another layer sandwiched therebetween are included in the "connection."

First Embodiment

FIG. 1 is a configuration diagram of a magnetic array 200 according to a first embodiment. The magnetic array 200 includes a plurality of magnetoresistance effect elements 100, a plurality of write lines WL, a plurality of common lines CL, a plurality of read lines RL, a plurality of first switching elements Sw1, a plurality of second switching elements Sw2, and a plurality of third switching elements Sw3. The magnetic array 200 can be utilized in, for example, a magnetic memory or the like.

Each of the write lines WL electrically connects a power supply and one or more magnetoresistance effect elements 100. Each of the common lines CL is a wiring used at both the time of writing and reading data. The common line CL electrically connects a reference potential and one or more magnetoresistance effect elements 100. The reference potential is, for example, the ground. The common line CL may be provided in each of the plurality of magnetoresistance effect elements 100, or may be provided across the plurality of magnetoresistance effect elements 100. Each of the read lines RL electrically connects the power supply and one or more magnetoresistance effect elements 100. The power supply is connected to the magnetic array 200 at the time of use.

Each magnetoresistance effect element 100 is connected to the first switching element Sw1, the second switching element Sw2, and the third switching element Sw3. The first switching element Sw1 is connected between the magnetoresistance effect element 100 and the write line WL. The second switching element Sw2 is connected between the magnetoresistance effect element 100 and the common line CL. The third switching element Sw3 is connected to the read line RL extending over the plurality of magnetoresistance effect elements 100.

When the first switching element Sw1 and the second switching element Sw2 are turned on, a write current flows between the write line WL and the common line CL which are connected to the predetermined magnetoresistance effect element 100. Due to the flow of the write current, data is written to the predetermined magnetoresistance effect element 100. When the second switching element Sw2 and the third switching element Sw3 are turned on, a read current flows between the common line CL and the read line RL which are connected to the predetermined magnetoresistance effect element 100. Due to the flow of the read current, data is read from the predetermined magnetoresistance effect element 100.

The first switching element Sw1, the second switching element Sw2, and the third switching element Sw3 are elements that control a flow of a current. The first switching element Sw1, the second switching element Sw2, and the third switching element Sw3 are, for example, transistors, elements utilizing a change in phase of a crystal layer such as ovonic threshold switches (OTS), elements utilizing a change in band structure such as metal-insulator transition (MIT) switches, elements utilizing a breakdown voltage such as Zener diodes and avalanche diodes, or elements whose conductivities change in accordance with change in atomic positions.

In the magnetic array 200 illustrated in FIG. 1, the magnetoresistance effect elements 100 connected to the same wiring share the third switching element Sw3. The third switching element Sw3 may be provided in each magnetoresistance effect element 100. Also, the third switching element Sw3 may be provided in each magnetoresistance effect element 100, and the first switching element Sw1 or the second switching element Sw2 may be shared by the magnetoresistance effect element 100 connected to the same wiring.

Figure 2:
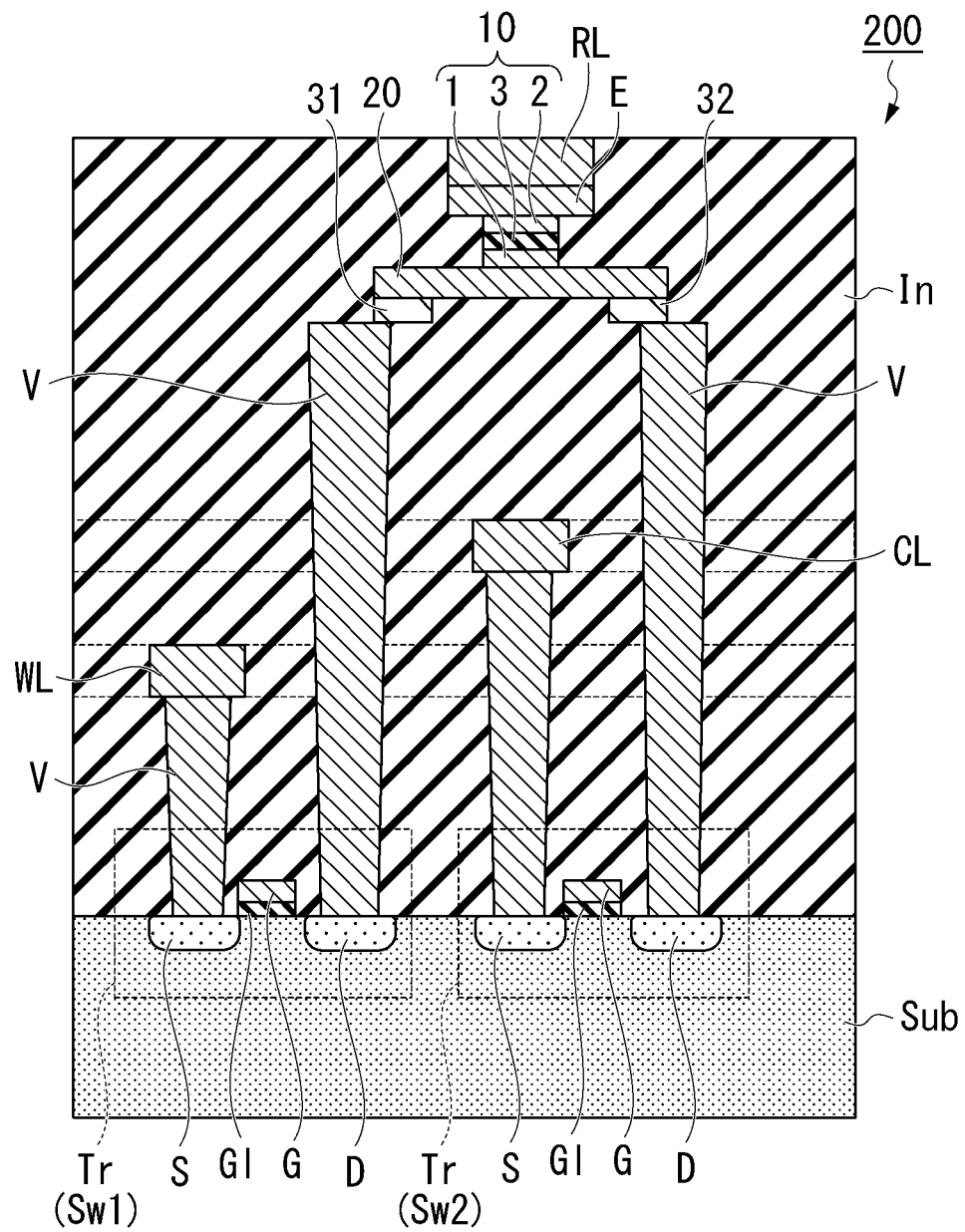
FIG. 2 is a cross-sectional view of a characteristic portion of the magnetic array according to the first embodiment.

FIG. 2 is a cross-sectional view of a characteristic portion of the magnetic array 200 according to the first embodiment. FIG. 2 is a cross section of the magnetoresistance effect element 100 taken along an xz plane passing through a center of a width in the y direction of a spin-orbit torque wiring 20 to be described later.

The first switching element Sw1 and the second switching element Sw2 illustrated in FIG. 2 are transistors Tr. The third switching element Sw3 is electrically connected to the read line RL and is positioned, for example, in the y direction of FIG. 2. The transistor Tr is, for example, a field effect transistor, and includes a gate electrode G, a gate insulating film GI, and a source S and a drain D formed in the substrate Sub. The substrate Sub is, for example, a semiconductor substrate.

The transistor Tr and the magnetoresistance effect element 100 are electrically connected via a via wiring V, first conductive layer 31, and the second conductive layer 32. Also, the transistor Tr is connected to the write line WL or the common line CL by the via wiring V. The via wiring V extends, for example, in the z direction. The read line RL is connected to a laminate 10 via an electrode E. The via wiring V, the electrode E, the first conductive layer 31, and the second conductive layer 32 contain a material having conductivity.

A vicinity of the magnetoresistance effect element 100 and the transistor Tr is covered with an insulating layer In. The insulating layer In is an insulating layer that insulates between wirings of multilayer wirings and between elements. The insulating layer In may be formed of, for example, silicon oxide ($SiO_x$), silicon nitride ($SiN_x$), silicon carbide (SiC), chromium nitride, silicon carbonitride (SiCN), silicon oxynitride (SiON), aluminum oxide ($Al_2O_3$), zirconium oxide ($ZrO_x$), magnesium oxide (MgO), aluminum nitride (AlN), or the like.

Figure 3:
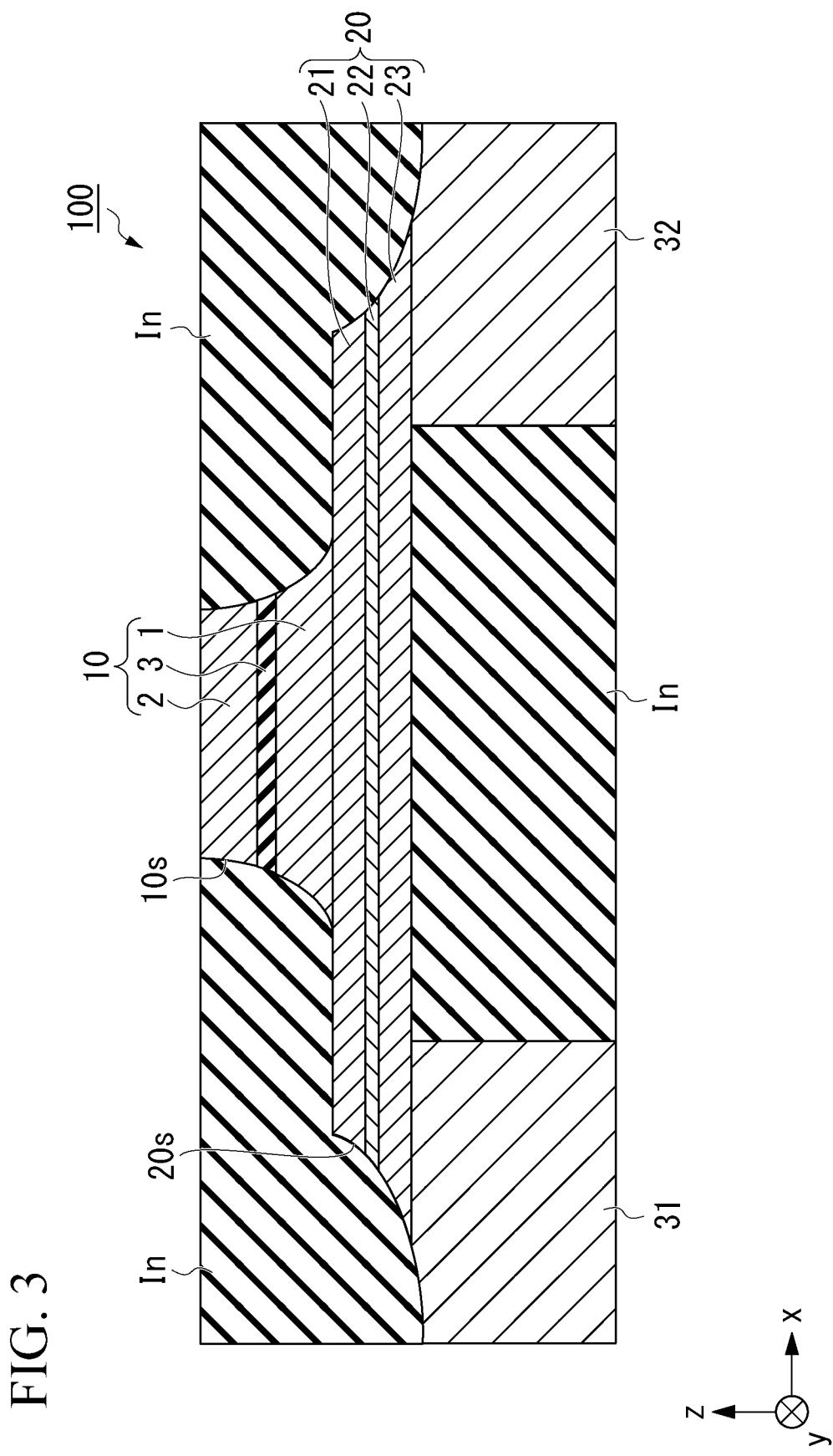
FIG. 3 is a cross-sectional view of a magnetoresistance effect element according to the first embodiment.
Figure 4:
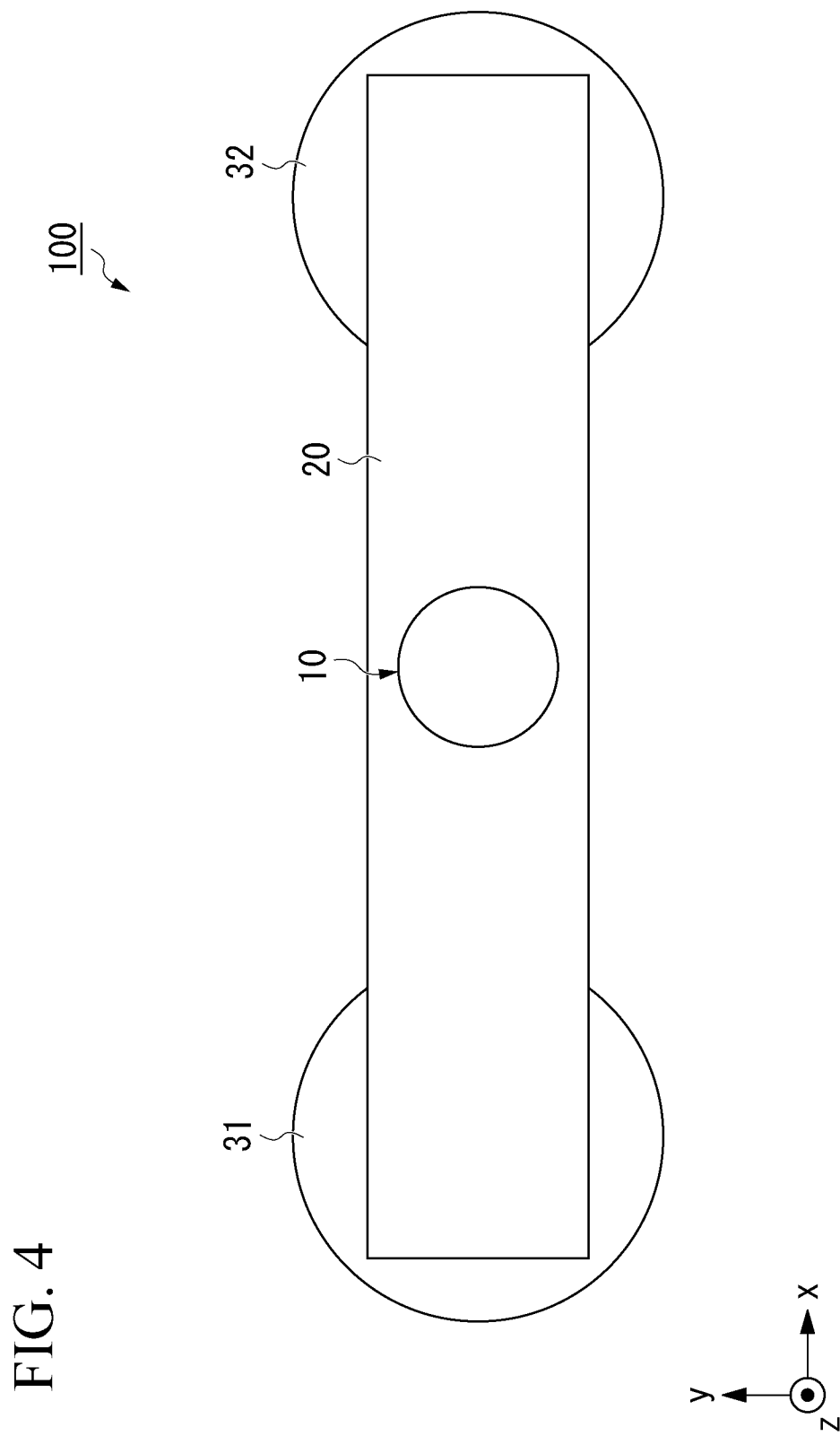
FIG. 4 is a plan view of the magnetoresistance effect element according to the first embodiment.

FIG. 3 is a cross-sectional view of the magnetoresistance effect element 100. FIG. 3 is a cross section of the magnetoresistance effect element 100 taken along the xz plane passing through a center of a width of the spin-orbit torque wiring 20 in the y direction. FIG. 4 is a plan view of the magnetoresistance effect element 100 from the z direction.

The magnetoresistance effect element 100 includes, for example, the laminate 10, the spin-orbit torque wiring 20, the first conductive layer 31, and the second conductive layer 32. The laminate 10 is electrically connected to the spin-orbit torque wiring 20. The laminate 10 is in physical contact with, for example, the spin-orbit torque wiring 20. The laminate 10 is laminated, for example, on or above the spin-orbit torque wiring 20. Another layer may be provided between the laminate 10 and the spin-orbit torque wiring 20. The first conductive layer 31 and the second conductive layer 32 are connected to the spin-orbit torque wiring 20. Another layer may be provided between each of the first conductive layer 31 and the second conductive layer 32, and the spin-orbit torque wiring 20. The first conductive layer 31 and the second conductive layer 32 are provided at positions sandwiching the laminate 10 when viewed from the z direction.

A resistance value of the laminate 10 in the z direction changes according to spins injected into the laminate 10 from the spin-orbit torque wiring 20. The magnetoresistance effect element 100 is a magnetic element utilizing a spin-orbit torque (SOT), and may be referred to as a spin-orbit torque magnetoresistance effect element, a spin-injection magnetoresistance effect element, or a spin-current magnetoresistance effect element.

The laminate 10 is sandwiched between the spin-orbit torque wiring 20 and the electrode E (see FIG. 2) in the z direction. The laminate 10 is a pillar body. A shape of the laminate 10 in a plan view from the z direction is, for example, circular, elliptical, or quadrangular. A side surface 10s of the laminate 10 is inclined with respect to, for example, the z direction.

The laminate 10 includes, for example, a first ferromagnetic layer 1, a second ferromagnetic layer 2, and a nonmagnetic layer 3. The first ferromagnetic layer 1 is in contact with, for example, the spin-orbit torque wiring 20 and laminated on the spin-orbit torque wiring 20. Spins are injected into the first ferromagnetic layer 1 from the spin-orbit torque wiring 20. Magnetization of the first ferromagnetic layer 1 receives a spin-orbit torque (SOT) due to the injected spins and an orientation direction thereof is changed. The second ferromagnetic layer 2 is provided in the z direction of the first ferromagnetic layer 1. The first ferromagnetic layer 1 and the second ferromagnetic layer 2 sandwich the nonmagnetic layer 3 in the z direction.

The first ferromagnetic layer 1 and the second ferromagnetic layer 2 each have magnetization. An orientation direction of a magnetization of the second ferromagnetic layer 2 is less likely to change than that of a magnetization of the first ferromagnetic layer 1 when a predetermined external force is applied. The first ferromagnetic layer 1 is referred to as a magnetization free layer, and the second ferromagnetic layer 2 is referred to as a magnetization fixed layer or a magnetization reference layer. The laminate 10 illustrated in FIG. 3 has a top pin structure in which the magnetization fixed layer is on a side far from the substrate Sub. A resistance value of the laminate 10 changes according to a difference in relative angle between the magnetization of the first ferromagnetic layer 1 and the magnetization of the second ferromagnetic layer 2 sandwiching the nonmagnetic layer 3.

The first ferromagnetic layer 1 and the second ferromagnetic layer 2 each contain a ferromagnetic material. The ferromagnetic material is, for example, a metal selected from the group consisting of Cr, Mn, Co, Fe, and Ni, an alloy containing one or more of these metals, an alloy containing these metals and at least one element of B, C, and N, or the like. The ferromagnetic material is, for example, Co—Fe, Co—Fe—B, Ni—Fe, a Co—Ho alloy, a Sm—Fe alloy, an Fe—Pt alloy, a Co—Pt alloy, or a CoCrPt alloy.

The first ferromagnetic layer 1 and the second ferromagnetic layer 2 may contain a Heusler alloy. A Heusler alloy contains an intermetallic compound having a chemical composition of XYZ or $X_2YZ$. X indicates a transition metal element of the Co, Fe, Ni, or Cu group, or a noble metal element in the periodic table, Y indicates a transition metal of the Mn, V, Cr, or Ti group, or types of the X element, and Z indicates a typical element from Group III to Group V. The Heusler alloy is, for example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, or the like. The Heusler alloy has a high spin polarization.

The nonmagnetic layer 3 contains a nonmagnetic material. When the nonmagnetic layer 3 is an insulator (in a case of a tunnel barrier layer), for example, $Al_2O_3$, $SiO_2$, MgO, $MgAl_2O_4$, or the like can be used for a material thereof. Also, in addition to these materials, a material in which a part of Al, Si, and Mg is substituted with Zn, Be, or the like can also be used. Of these, since MgO and $MgAl_2O_4$ are materials that can realize coherent tunneling, spins can be efficiently injected. When the nonmagnetic layer 3 is a metal, Cu, Au, Ag, or the like can be used for a material thereof. Further, when the nonmagnetic layer 3 is a semiconductor, Si, Ge, $CuInSe_2$, $CuGaSe_2$, $Cu(In, Ga)Se_2$, or the like can be used for a material thereof.

The laminate 10 may have layers other than the first ferromagnetic layer 1, the second ferromagnetic layer 2, and the nonmagnetic layer 3. For example, an underlayer may be provided between the spin-orbit torque wiring 20 and the first ferromagnetic layer 1. The underlayer enhances crystallinity of each layer constituting the laminate 10.

Also, for example, a cap layer may be provided on an uppermost surface of the laminate 10.

Also, the laminate 10 may have a ferromagnetic layer on a surface of the second ferromagnetic layer 2 opposite to the nonmagnetic layer 3 via a spacer layer. The second ferromagnetic layer 2, the spacer layer, and the ferromagnetic layer have a synthetic antiferromagnetic structure (SAF structure). The synthetic antiferromagnetic structure is made of two magnetic layers sandwiching a nonmagnetic layer therebetween. When the second ferromagnetic layer 2 and the ferromagnetic layer are antiferromagnetically coupled, a coercive force of the second ferromagnetic layer 2 is larger than that in a case without the ferromagnetic layer. The ferromagnetic layer is, for example, IrMn, PtMn, or the like.

The spacer layer contains, for example, at least one selected from the group consisting of Ru, Ir, and Rh.

The spin-orbit torque wiring 20 has a length in the x direction that is, for example, longer than that in the y direction when viewed from the z direction, and extends in the x direction. A write current flows in the x direction of the spin-orbit torque wiring 20. At least a part of the spin-orbit torque wiring 20, together with the nonmagnetic layer 3, sandwiches the first ferromagnetic layer 1 in the z direction.

The spin-orbit torque wiring 20 generates a spin current due to a spin Hall effect when a current I flows therethrough, and injects the spin into the first ferromagnetic layer 1. For example, the spin-orbit torque wiring 20 applies as much spin-orbit torque (SOT) as the magnetization of the first ferromagnetic layer 1 can be reversed to the magnetization of the first ferromagnetic layer 1. The spin Hall effect is a phenomenon in which a spin current is induced in a direction perpendicular to a direction in which a current flows on the basis of a spin-orbit interaction when the current is caused to flow. The spin Hall effect is the same as a normal Hall effect in that a movement (traveling) direction of moving (traveling) charge (electron) is bent. In the normal Hall effect, a movement direction of charged particles moving in a magnetic field is bent by a Lorentz force. On the other hand, in the spin Hall effect, a movement direction of spin is bent due to only movement of electrons (due to only a flow of current) even though a magnetic field is absent.

For example, when a current flows through the spin-orbit torque wiring 20, a first spin oriented in one direction and a second spin oriented in a direction opposite to the first spin are each bent in a direction perpendicular to a direction in which the current I flows by the spin Hall effect. For example, the first spin oriented in a −y direction is bent in the +z direction, and the second spin oriented in a +y direction is bent in the −z direction.

In a nonmagnetic material (a material that is not a ferromagnetic material), the number of electrons of the first spin and the number of electrons of the second spin generated by the spin Hall effect are equal. That is, the number of electrons of the first spin directed in the +z direction and the number of electrons of the second spin directed in the −z direction are equal. The first spin and the second spin flow in a direction to eliminate an uneven distribution of the spins. In the movement of the first spin and the second spin in the z direction, flows of charges cancel each other out, and thus an amount of current is zero. A spin current without a current is particularly referred to as a pure spin current.

When a flow of electrons in the first spin is expressed as $J_\uparrow$, a flow of electrons in the second spin is expressed as $J_\downarrow$, and a spin current is expressed as $J_S$, $J_S=J_\uparrow-J_\downarrow$ is defined. The spin current $J_S$ is generated in the z direction. The first spin is injected into the first ferromagnetic layer 1 from the spin-orbit torque wiring 20.

The spin-orbit torque wiring 20 includes a first layer 21, a second layer 22, and a third layer 23 in order from a side closer to the first ferromagnetic layer 1. The second layer 22 is between the first layer 21 and the third layer 23. The first layer 21 is closer to the first ferromagnetic layer 1 than the third layer 23 is. Materials or compositions forming the first layer 21, the second layer 22, and the third layer 23 are respectively different.

A coefficient of linear expansion of a material forming the second layer 22 is between a coefficient of linear expansion of a material forming the first layer 21 and a coefficient of linear expansion of a material forming the third layer 23. For example, the coefficient of linear expansion of the material forming the second layer 22 is larger than the coefficient of linear expansion of the material forming the first layer 21 and smaller than the coefficient of linear expansion of the material forming the third layer 23. In this case, a difference between the coefficient of linear expansion of the material forming the third layer 23 and the coefficient of linear expansion of the material forming the second layer 22 is preferably 70% or less of a difference between the coefficient of linear expansion of the material forming the third layer 23 and the coefficient of linear expansion of the material forming the first layer 21, and a difference between the coefficient of linear expansion of the material forming the second layer 22 and the coefficient of linear expansion of the material forming the first layer 21 is preferably 70% or less of the difference between the coefficient of linear expansion of the material forming the third layer 23 and the coefficient of linear expansion of the material forming the first layer 21. Also, for example, the coefficient of linear expansion of the material forming the second layer 22 is smaller than the coefficient of linear expansion of the material forming the first layer 21 and larger than the coefficient of linear expansion of the material forming the third layer 23. In this case, a difference between the coefficient of linear expansion of the material forming the first layer 21 and the coefficient of linear expansion of the material forming the second layer 22 is preferably 70% or less of a difference between the coefficient of linear expansion of the material forming the first layer 21 and the coefficient of linear expansion of the material forming the third layer 23, and a difference between the coefficient of linear expansion of the material forming the second layer 22 and the coefficient of linear expansion of the material forming the third layer 23 is preferably 70% or less of the difference between the coefficient of linear expansion of the material forming the first layer 21 and the coefficient of linear expansion of the material forming the third layer 23. When this configuration is satisfied, the second layer 22 alleviates a thermal stress applied to the first layer 21 and the third layer. The second layer 22 is a stress alleviation layer.

A coefficient of linear expansion is a rate of change in length in response to a rise in temperature, and is expressed by $\alpha=1/\Delta T \times \Delta L/L$. $\alpha$ is a coefficient of linear expansion, $\Delta T$ is a change in temperature, $\Delta L$ is an amount of change in length, and L is a length. The coefficient of linear expansion is a coefficient of linear expansion in an operating temperature range, and the length L used as a reference for calculation is a length in the operating temperature range. The operating temperature range refers to a temperature at which the magnetoresistance effect element 100 is most frequently used, and normally is 25° C. when driven at room temperature. Since the coefficient of linear expansion does not have a thickness parameter, it can be obtained by depositing a film of the material constituting each layer to a thickness to such an extent that it can be measured under the same condition as each layer, and then evaluating the deposited film.

Also, when a main element forming each layer is a specific element, a coefficient of linear expansion of the main element may be regarded as the coefficient of linear expansion of each layer. The main element refers to an element with a highest composition ratio among elements forming each layer. When a proportion occupied by the main element is 50% or more of elements forming each layer, a coefficient of linear expansion of the main element can be regarded as an approximate coefficient of linear expansion of each layer. Coefficients of linear expansion of some elements are illustrated in the table below.

TABLE 1

| Substance: simple substance | Symbol for element | Atomic number | Thermal expansion coefficient ($10^{-6}$/K) | | | |
|---|---|---|---|---|---|---|
| | | | 100K (−173° C.) | 293K (20° C.) | 500K (227° C.) | 25° C. |
| Carbon (diamond) | C | 6 | 0.05 | 1 | 2.3 | 0.8 |
| Silicon | Si | 14 | −0.4 | 2.6 | 3.5 | 2.6 |
| Tungsten | W | 74 | 2.6 | 4.5 | 4.6 | 4.5 |
| Molybdenum | Mo | 42 | | | 5.2 | 4.8 |
| Chromium | Cr | 24 | 2.3 | 4.9 | 8.8 | 4.9 |
| Boron | B | 5 | | 4.7 | 5.4 | 5 |
| Osmium | Os | 76 | — | 4.7 | — | 5.1 |
| Hafnium | Hf | 72 | | | | 5.9 |
| Germanium | Ge | 32 | 2.4 | 5.7 | 6.5 | 6 |
| Tantalum | Ta | 73 | 4.8 | 6.3 | 6.8 | 6.3 |
| Ruthenium | Ru | 44 | | | | 6.4 |
| Iridium | Ir | 77 | 4.4 | 6.4 | 7.2 | 6.4 |
| Rhodium | Rh | 45 | 5 | 8.2 | 9.3 | 8.2 |
| Vanadium | V | 23 | 5.1 | 8.4 | 9.9 | 8.4 |
| Titanium | Ti | 22 | 4.5 | 8.6 | 9.9 | 8.6 |
| Platinum | Pt | 78 | 6.6 | 8.8 | 9.6 | 8.8 |
| Antimony | Sb | 51 | 9.1 | 11 | 11.7 | 11 |
| Iron | Fe | 26 | 5.6 | 11.8 | 14.4 | 11.8 |
| Palladium | Pd | 46 | 8 | 11.8 | 13.2 | 11.8 |
| Cobalt | Co | 27 | 6.8 | 13 | 15 | 13 |
| Nickel | Ni | 28 | 6.6 | 13.4 | 15.3 | 13.4 |
| Bismuth | Bi | 83 | 12.3 | 13.4 | 12.7 | 13.4 |
| Gold | Au | 79 | 11.8 | 14.2 | 15.4 | 14.2 |
| Copper | Cu | 29 | 10.3 | 16.5 | 18.3 | 16.5 |
| Silver | Ag | 47 | 14.2 | 18.9 | 20.6 | 18.9 |
| Manganese | Mn | 25 | | | | 21.7 |
| Tin | Sn | 50 | 16.5 | 22 | 27.2 | 22 |
| Aluminum | Al | 13 | 12.2 | 23.1 | 26.4 | 23.1 |
| Magnesium | Mg | 12 | 14.6 | 24.8 | 29.1 | 24.8 |
| Lead | Pb | 82 | 25.6 | 28.9 | 33.3 | 28.9 |
| Zinc | Zn | 30 | 24.5 | 30.2 | 32.8 | 30.2 |
| Cadmium | Cd | 48 | 26.9 | 30.8 | 36 | 30.8 |
| Indium | In | 49 | 25.4 | 32.1 | — | 32.1 |

TABLE 1-continued

| Substance: simple substance | Symbol for element | Atomic number | Thermal expansion coefficient ($10^{-6}$/K) | | | |
|---|---|---|---|---|---|---|
| | | | 100K (−173° C.) | 293K (20° C.) | 500K (227° C.) | 25° C. |
| Potassium | K | 19 | — | 85 | — | 83.3 |
| Beryllium | Be | 4 | 1.3 | 11.3 | 15.1 | |
| Carbon (graphite) | C | 6 | | 3.1 | 3.3 | |
| Tellurium | Te | 52 | — | 16.8 | — | |

For example, when the first layer 21 contains a first element as a main element, the second layer contains a second element as a main element, and the third layer contains a third element as a main element, a coefficient of linear expansion of the second element is preferably between a coefficient of linear expansion of the first element and a coefficient of linear expansion of the third element. For example, the coefficient of linear expansion of the second element is preferably larger than the coefficient of linear expansion of the first element and smaller than the coefficient of linear expansion of the third element. In this case, a difference between the coefficient of linear expansion of the third element and the coefficient of linear expansion of the second element is preferably 70% or less of a difference between the coefficient of linear expansion of the third element and the coefficient of linear expansion of the first element, and a difference between the coefficient of linear expansion of the second element and the coefficient of linear expansion of the first element is preferably 70% or less of the difference between the coefficient of linear expansion of the third element and the coefficient of linear expansion of the first element. Also, for example, the coefficient of linear expansion of the second element is preferably smaller than the coefficient of linear expansion of the first element and larger than the coefficient of linear expansion of the third element. In this case, a difference between the coefficient of linear expansion of the first element and the coefficient of linear expansion of the second element is preferably 70% or less of a difference between the coefficient of linear expansion of the first element and the coefficient of linear expansion of the third element, and a difference between the coefficient of linear expansion of the second element and the coefficient of linear expansion of the third element is preferably 70% or less of the difference between the coefficient of linear expansion of the first element and the coefficient of linear expansion of the third element.

The first layer 21 contains, for example, one or more of Au, Bi, Hf, Ir, Mo, Pd, Pt, Rh, Ru, Ta, W, Ag, Al, Cu, Ge, and Si. The main element (first element) of the first layer 21 is, for example, any one of these elements. The first layer 21 may be a single metal, an alloy, an intermetallic compound, or a nitride.

The first layer 21 is positioned closer to the first ferromagnetic layer 1 than the second layer 22 and the third layer 23 are, and spins generated in the first layer 21 do not easily diffuse into the first ferromagnetic layer 1. Therefore, the first layer 21 is preferably made of a material that can inject a large amount of spin into the first ferromagnetic layer 1.

A stronger spin-orbit interaction is generated in a nonmagnetic heavy metal than in other metals. Therefore, the first layer 21 preferably contains a nonmagnetic heavy metal. A heavy metal means a metal having a specific gravity equal to or higher than that of yttrium (Y). The nonmagnetic heavy metal is, for example, a nonmagnetic metal having a high atomic number such as the atomic number of 39 or higher having d electrons or f electrons in the outermost shell. The first layer 21 contains, for example, one or more of Au, Bi, Hf, Ir, Mo, Pd, Pt, Rh, Ru, Ta, and W. The main element (first element) of the first layer 21 is preferably, for example, any one of these elements.

The second layer 22 contains, for example, one or more of Ag, Au, Bi, Co, Cr, Cu, Fe, Ge, Hf, Ir, Mo, Ni, Pd, Pt, Rh, Ru, and Ta. The main element (second element) of the second layer 22 is, for example, any one of these elements. The second layer 22 may be a single metal, an alloy, an intermetallic compound, or a nitride.

The third layer 23 contains, for example, one or more of Au, Bi, Hf, Ir, Mo, Pd, Pt, Rh, Ru, Ta, W, Ag, Al, Cu, Ge, and Si. The main element (third element) of the third layer 23 is, for example, any one of these elements. The third layer 23 may be a single metal, an alloy, an intermetallic compound, or a nitride.

The third layer 23 is disposed farther from the first ferromagnetic layer 1 than the first layer 21 and the second layer 22 are, and some of spins generated in the third layer 23 are diffused until they reach the first ferromagnetic layer 1. Therefore, it is preferable that the third layer 23 have a function other than a function of generating a large amount of spin.

A light metal has superior electrical conductivity and thermal conductivity compared to a heavy metal. Therefore, the third layer 23 preferably contains a light metal. The third layer 23 contains, for example, one or more of Ag, Al, Cu, Ge, and Si. The main element (third element) of the third layer 23 is preferably, for example, any one of these elements.

The first element, the second element, and the third element are not arbitrarily selected from the elements described above, and are selected such that the coefficient of linear expansion of the second element is between the coefficient of linear expansion of the first element and the coefficient of linear expansion of the third element.

For example, a combination of W as the first element, Ir as the second element, and Cu as the third element, a combination of W as the first element, Pt as the second element, and Cu as the third element, a combination of W as the first element, Ta as the second element, and Cu as the third element, and a combination of W as the first element, Hf as the second element, and Cu as the third element can be mentioned.

A side surface 20s of the spin-orbit torque wiring 20 is inclined, for example, with respect to the z direction. Therefore, a perimeter of the first layer 21 is smaller than perimeters of the second layer 22 and the third layer 23, and a perimeter of the second layer 22 is smaller than a perimeter of the third layer 23. The perimeter is a perimeter of an upper surface of each layer on a side far from the substrate Sub. When a width in the x direction becomes smaller in the z direction, a flow of the current between the first conductive layer 31 and the second conductive layer 32 becomes smoother. Since the side surface 20s is inclined with respect to the z direction, a surface area of the spin-orbit torque wiring 20 is increased, and heat dissipation is improved.

Also, when a length of the first layer 21 in the x direction is smaller than a length of the third layer 23 in the x direction, the coefficient of linear expansion of the first layer 21 is larger than the coefficient of linear expansion of the third layer 23 according to the relational expression $\alpha=1/\Delta T \times \Delta L/L$. When coefficients of linear expansion of the layers satisfy a relationship of "coefficient of linear expansion of the third layer 23">"coefficient of linear expansion of the second layer 22">"coefficient of linear expansion of the first layer 21," a difference in coefficient of linear expansion of the layers can be reduced.

A film thickness of the second layer 22 is, for example, smaller than film thicknesses of the first layer 21 and the third layer 23. Spins generated in the third layer 23 being diffused in the second layer 22 can be suppressed.

Also, the film thickness of the first layer 21 is larger than, for example, the film thickness of the third layer. Since the first layer 21 is in contact with the first ferromagnetic layer 1, if the layer is thick, an efficiency of spin injection into the first ferromagnetic layer 1 increases.

Each layer constituting the spin-orbit torque wiring 20 may also contain a magnetic metal or a topological insulator. A topological insulator is a material in which the interior of the material is an insulator or a high resistance body, but a spin-polarized metal state is generated on its surface.

Each of the first conductive layer 31 and the second conductive layer 32 is an example of a conductive layer. The first conductive layer 31 and the second conductive layer 32 are each made of a highly conductive material. The first conductive layer 31 and the second conductive layer 32 are, for example, Al, Cu, W, or Cr.

Next, a method of manufacturing the magnetoresistance effect element 100 will be described. The magnetoresistance effect element 100 is formed by a laminating step of each layer, and a processing step of processing a part of each layer into a predetermined shape. A sputtering method, a chemical vapor deposition (CVD) method, an electron beam evaporation method (EB evaporation method), an atomic laser deposition method, or the like can be used for lamination of each layer. Processing of each layer can be performed using photolithography, and the like.

First, predetermined positions of the substrate Sub are doped with impurities to form a source S and a drain D. Next, a gate insulating film GI and a gate electrode G are formed between the source S and the drain D. The source S, the drain D, the gate insulating film GI, and the gate electrode G form a transistor Tr.

Next, the insulating layer In is formed to cover the transistor Tr. Also, the via wiring V, the first conductive layer 31, and the second conductive layer 32 are formed by forming an opening in the insulating layer In and filling the opening with a conductor. The write line WL and the common line CL are formed by laminating the insulating layer In to a predetermined thickness, forming a groove on the insulating layer In, and filling the groove with a conductor.

Next, a metal layer, a ferromagnetic layer, a nonmagnetic layer, a ferromagnetic layer, and a hard mask layer are laminated in that order on one surface of the insulating layer In, the first conductive layer 31 and the second conductive layer 32. Next, the hard mask layer is processed into a predetermined shape. The predetermined shape is, for example, an outer shape of the spin-orbit torque wiring 20. Next, the metal layer, the ferromagnetic layer, the nonmagnetic layer, and the ferromagnetic layer are processed into a predetermined shape at once through the hard mask layer. The metal layer is processed into a predetermined shape to form the spin-orbit torque wiring 20.

Next, an unnecessary portion of the hard mask layer in the x direction are removed. The hard mask layer forms an outer shape of the laminate 10. Next, an unnecessary portion in the x direction of the laminate formed on the spin-orbit torque wiring 20 is removed through the hard mask layer. The laminate 10 is processed into a predetermined shape to be the laminate 10. The hard mask layer is the electrode E. Next, the insulating layer In is filled around the laminate 10 and the spin-orbit torque wiring 20, and thereby the magnetoresistance effect element 100 is obtained.

In the magnetoresistance effect element 100 according to the first embodiment, the coefficient of linear expansion of the material forming the second layer 22 is between the coefficient of linear expansion of the material forming the first layer 21 and the coefficient of linear expansion of the material forming the third layer 23, and thereby a thermal stress generated in the spin-orbit torque wiring 20 can be alleviated. As a result, the magnetoresistance effect element 100 can suppress occurrence of peeling, cracks, or the like between layers due to heat generated during writing, and can prevent deterioration of the spin-orbit torque wiring 20.

An example of the magnetoresistance effect element 100 according to the first embodiment has been described above, but additions, omissions, substitutions, and other changes to the configuration can be made within a scope not departing from the gist of the present invention.

Figure 5:
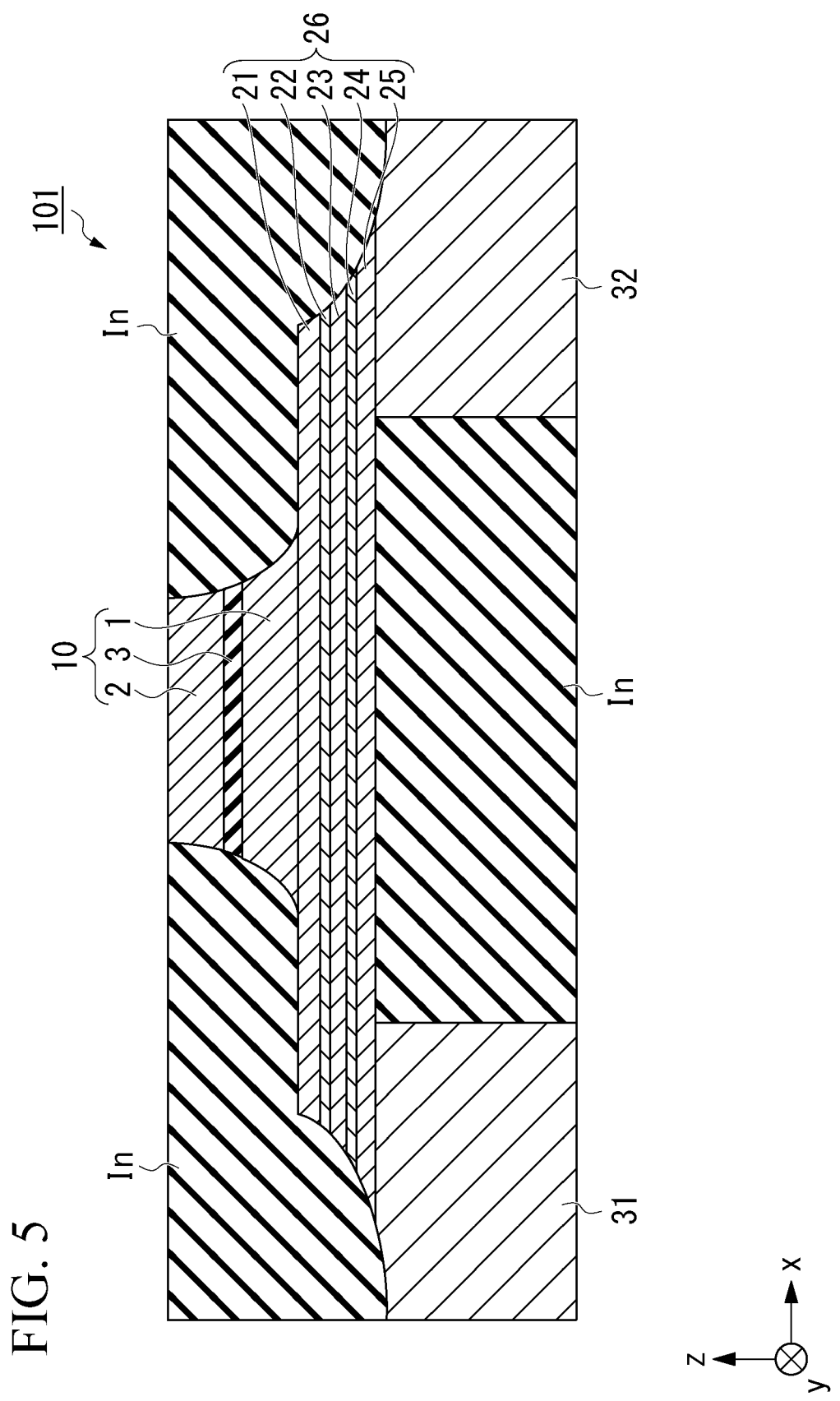
FIG. 5 is a cross-sectional view of a magnetoresistance effect element according to a first modified example.

FIG. 5 is a cross-sectional view of a magnetoresistance effect element 101 according to a first modified example. FIG. 5 is an xz cross section passing through a center of a spin-orbit torque wiring 26 in the y direction. In FIG. 5, components the same as those in FIG. 3 are denoted by the same reference signs, and descriptions thereof will be omitted.

A spin-orbit torque wiring 26 includes the first layer 21, the second layer 22, the third layer 23, a fourth layer 24, and a fifth layer 25. The fourth layer 24 is between the third layer 23 and the fifth layer 25. Although an example in which the fourth layer 24 and the fifth layer 25 are each one layer is illustrated in FIG. 5, they may each have a plurality of layers. When the fourth layer 24 and the fifth layer 25 each have a plurality of layers, the fourth layer 24 and the fifth layer 25 are alternately laminated in an order of the fourth layer 24 and the fifth layer 25 from a side closer to the third layer 23.

The fourth layer 24 contains the same material as the second layer 22. The fourth layer 24 is made of the same material as, for example, the second layer 22. The fifth layer 25 contains the same material as the first layer 21 or the third layer 23. The fifth layer 25 is made of the same material as, for example, the first layer 21 or the third layer 23.

The magnetoresistance effect element 101 according to the first modified example can obtain the same effects as those of the magnetoresistance effect element 100 according to the first embodiment. Also, when the number of layers constituting the spin-orbit torque wiring 26 increases, a current is branched off into each layer, and thereby an amount of current flowing through each layer is reduced. Therefore, heat generation in each layer can be suppressed, and occurrence of a thermal stress can be suppressed. Also, when an interface between different substances in the spin-orbit torque wiring 26 increases, a Rashba effect is amplified, and an efficiency of reversing magnetization of the first ferromagnetic layer 1 can be enhanced.

Figure 6:
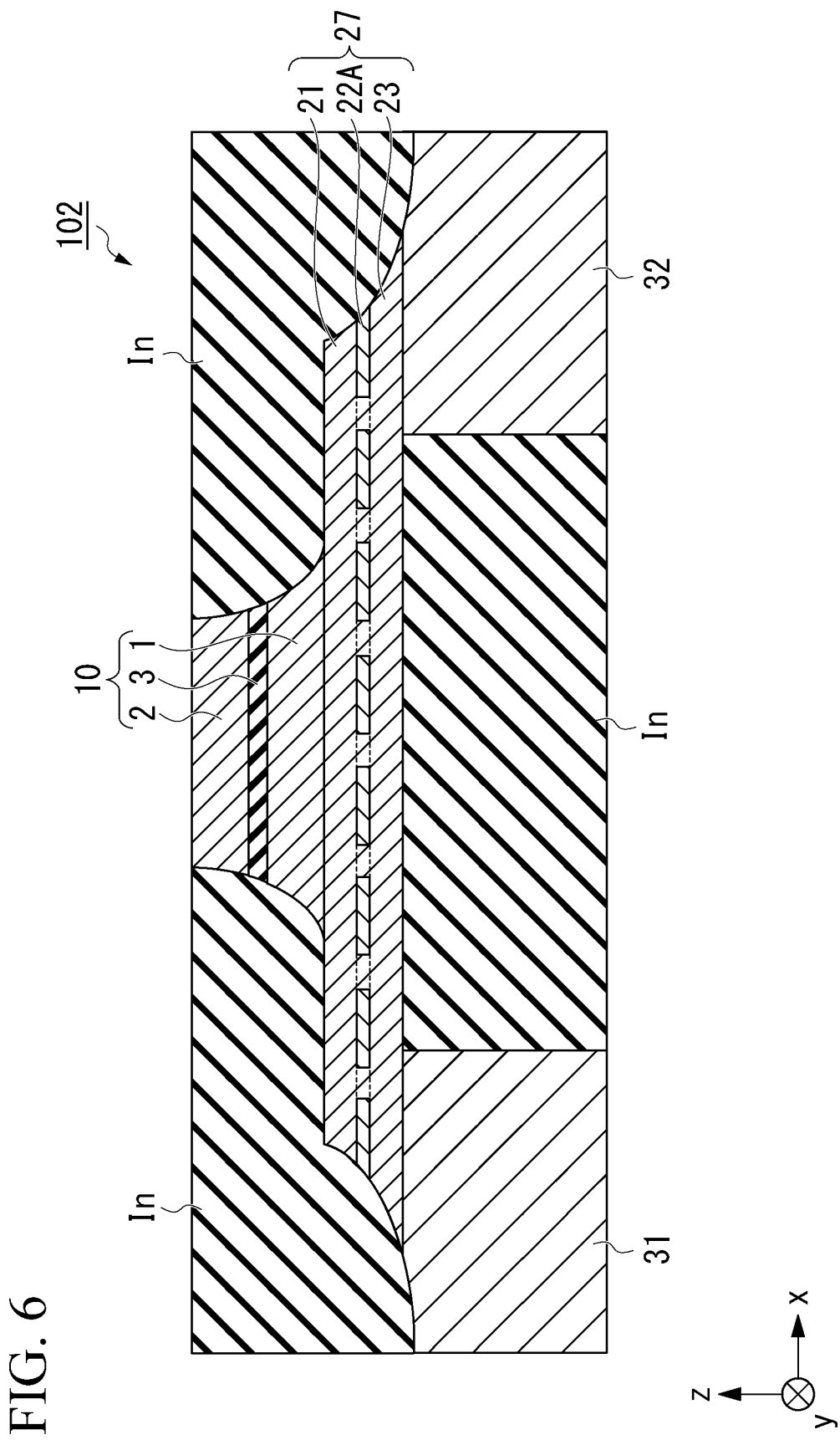
FIG. 6 is a cross-sectional view of a magnetoresistance effect element according to a second modified example.

FIG. 6 is a cross-sectional view of a magnetoresistance effect element 102 according to a second modified example. FIG. 6 is an xz cross section passing through a center of a spin-orbit torque wiring 27 in the y direction. In FIG. 6, components the same as those in FIG. 3 are denoted by the same reference signs, and descriptions thereof will be omitted.

The spin-orbit torque wiring 27 includes the first layer 21, a second layer 22A, and the third layer 23. The second layer 22A is different from the second layer 22 according to the first embodiment in that it is not a uniform continuous film, but a continuous film having a plurality of openings or a layer including a plurality of constituent elements scattered in an island shape.

Figure 7:
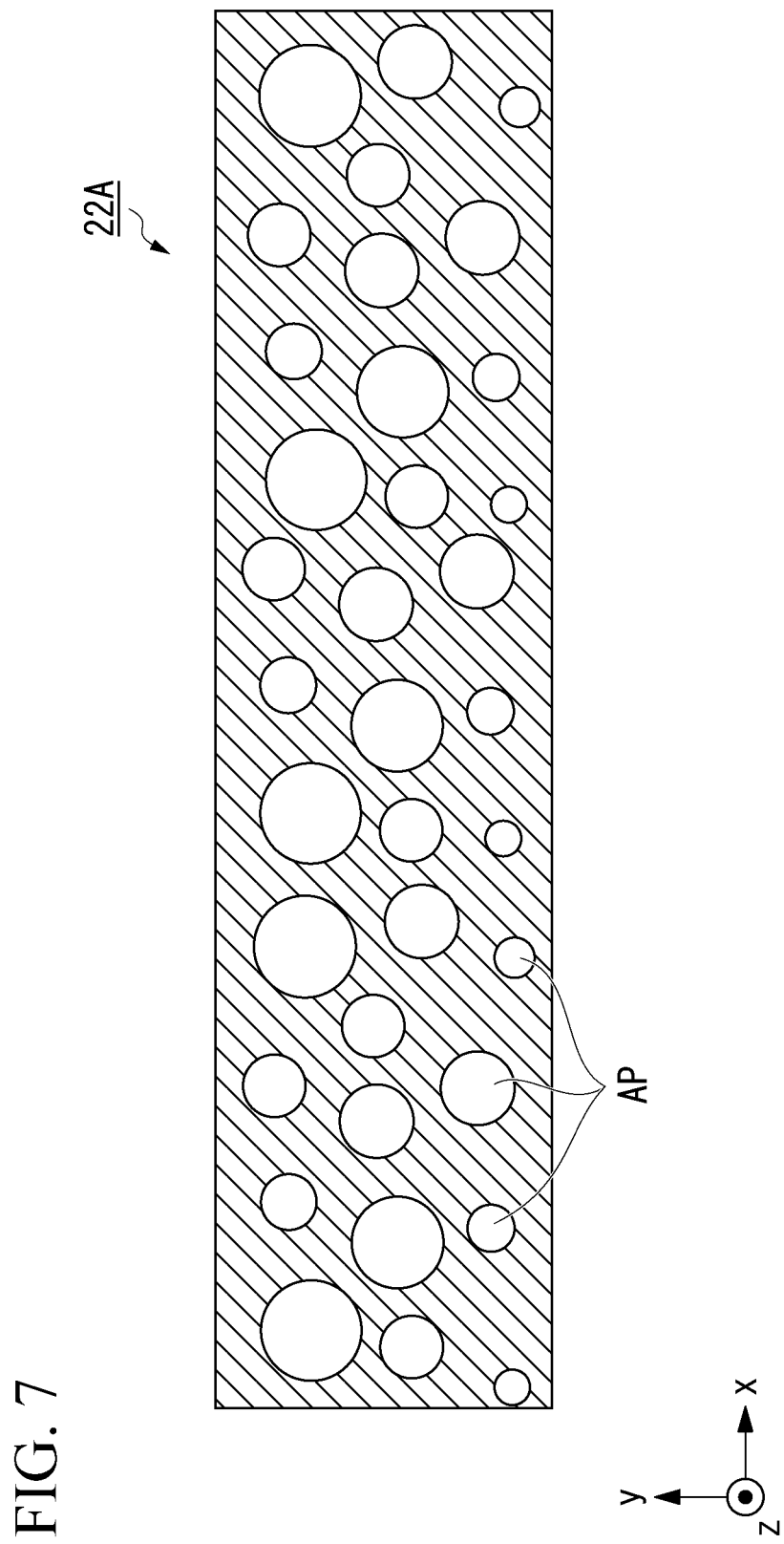
FIG. 7 is an example of a plan view of a second layer according to the second modified example.
Figure 8:
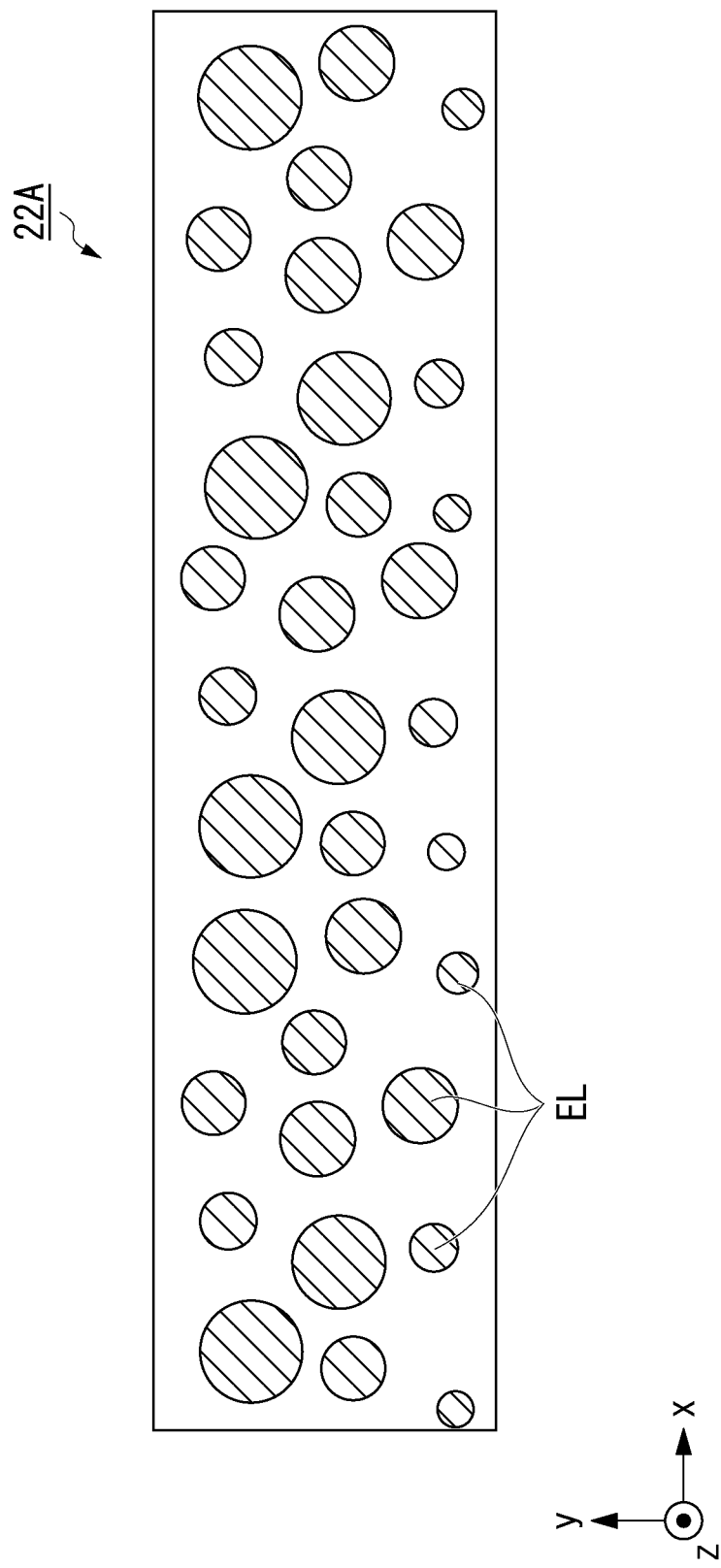
FIG. 8 is another example of a plan view of the second layer according to the second modified example.

FIGS. 7 and 8 are plan views of the magnetoresistance effect element 102 according to the second modified example. The second layer 22A illustrated in FIG. 7 is an example of a continuous film having a plurality of openings AP. The second layer 22A illustrated in FIG. 8 is an example of a layer including a plurality of constituent elements EL scattered in an island shape. If a film thickness of the second layer 22A is small, the second layer 22A may not become a uniform continuous film. A material of the first layer 21 or the third layer 23 is filled between the openings AP and between the constituent elements EL.

The magnetoresistance effect element 102 according to the second modified example can obtain the same effects as those of the magnetoresistance effect element 100 according to the first embodiment. Also, a stress generated in an in-plane direction is alleviated between the openings AP and between the constituent elements EL. As a result, deterioration of the spin-orbit torque wiring 26 can be prevented.

Figure 9:
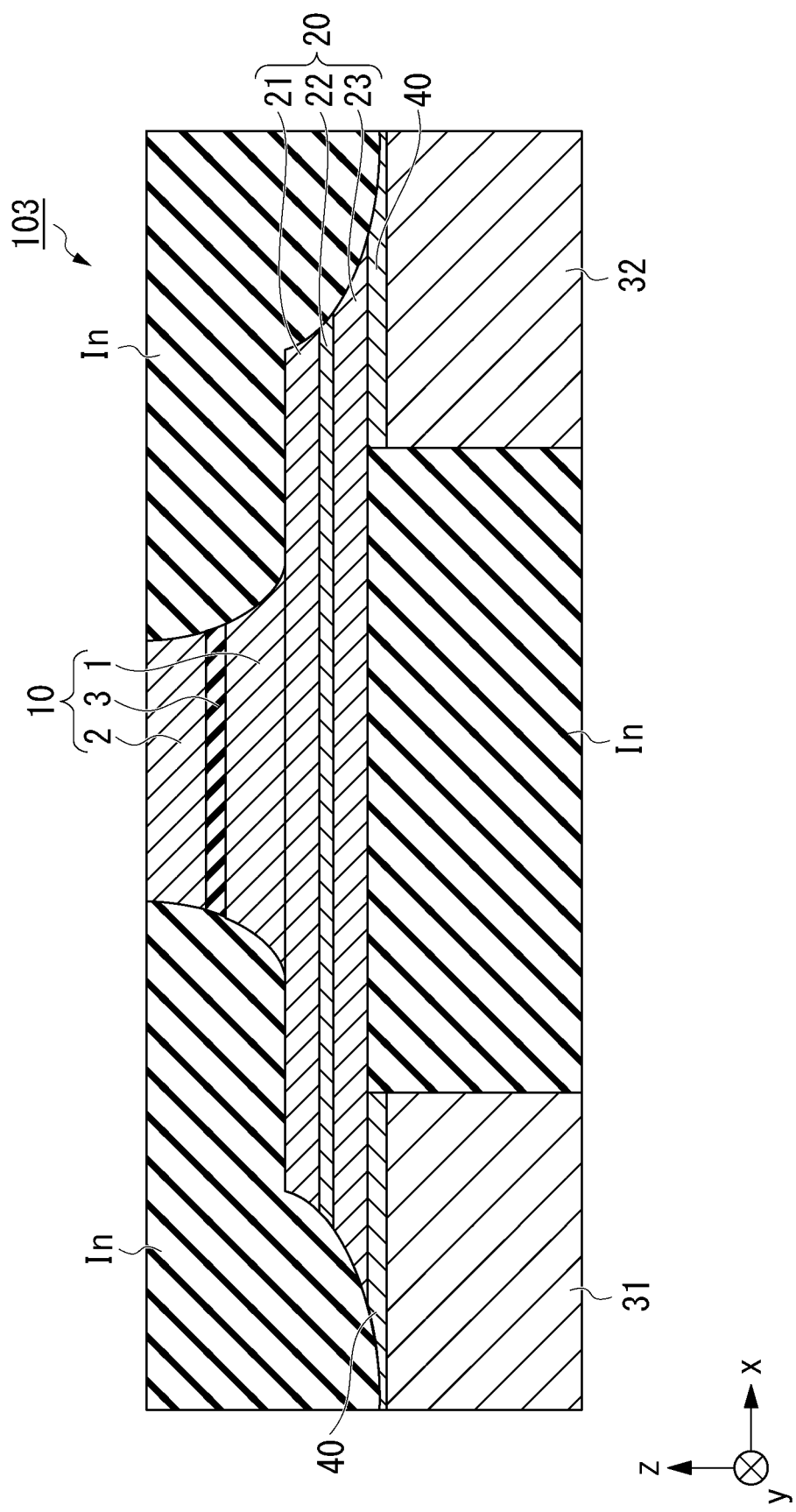
FIG. 9 is a cross-sectional view of a magnetoresistance effect element according to a third modified example.

FIG. 9 is a cross-sectional view of a magnetoresistance effect element 103 according to a third modified example. FIG. 9 is an xz cross section passing through a center of the spin-orbit torque wiring 20 in the y direction. In FIG. 9, components the same as those in FIG. 3 are denoted by the same reference signs, and descriptions thereof will be omitted.

The magnetoresistance effect element 103 differs from the magnetoresistance effect element 100 according to the first embodiment in that it includes an intermediate layer 40. The intermediate layer 40 is provided between the first conductive layer 31 and the spin-orbit torque wiring 20 and between the second conductive layer 32 and the spin-orbit torque wiring 20. The intermediate layer 40 may be provided only one of between the first conductive layer 31 and the spin-orbit torque wiring 20 and between the second conductive layer 32 and the spin-orbit torque wiring 20.

A coefficient of linear expansion of a material forming the intermediate layer 40 is, for example, between the coefficient of linear expansion of the third layer 23 and that of the first conductive layer 31 or the second conductive layer 32. If the fourth layer 40 is in contact with the first layer 21, the coefficient of linear expansion of the material forming the fourth layer 40 is, for example, between the coefficient of linear expansion of the first layer 21 and that of the first conductive layer 31 or the second conductive layer 32.

The magnetoresistance effect element 103 according to the third modified example can obtain the same effects as those of the magnetoresistance effect element 100 according to the first embodiment. Also, the intermediate layer 40 can alleviate a difference in thermal stress between the first conductive layer 31 or the second conductive layer 32 and the spin-orbit torque wiring 20, and thereby peeling or the like at an interface therebetween can be suppressed.

Figure 10:
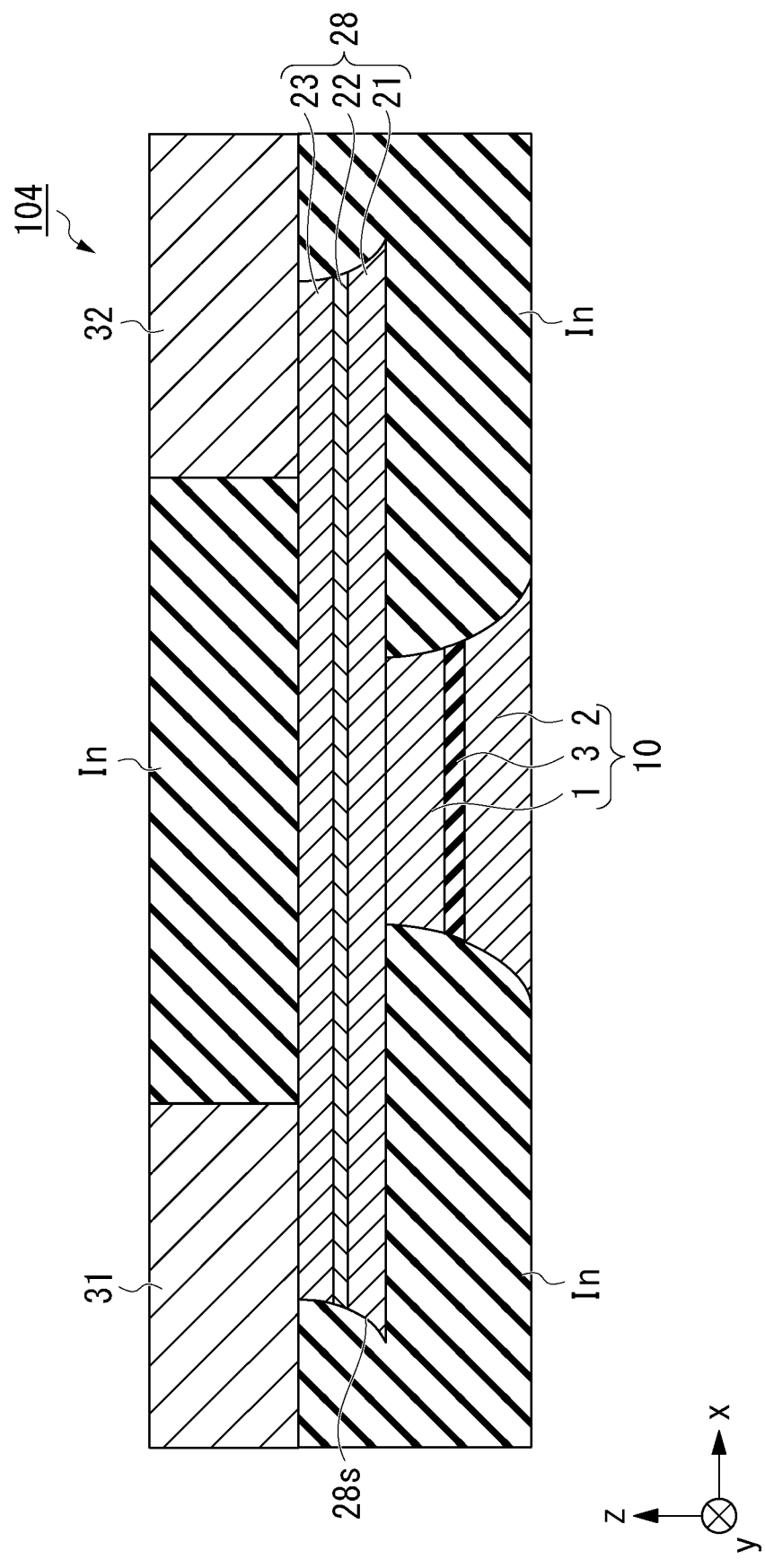
FIG. 10 is a cross-sectional view of a magnetoresistance effect element according to a fourth modified example.

FIG. 10 is a cross-sectional view of a magnetoresistance effect element 104 according to a fourth modified example. FIG. 10 is an xz cross section passing through a center of a spin-orbit torque wiring 28 in the y direction. In FIG. 10, components the same as those in FIG. 3 are denoted by the same reference signs, and descriptions thereof will be omitted.

The laminate 10 illustrated in FIG. 10 has a bottom pin structure in which a magnetization fixed layer (second ferromagnetic layer 2) is positioned close to the substrate Sub. In the spin-orbit torque wiring 28, the first layer 21, the second layer 22, and the third layer 23 are laminated in order from a side closer to the substrate Sub.

The spin-orbit torque wiring 28 is, for example, on the laminate 10. A side surface 28s of the spin-orbit torque wiring 28 is inclined, for example, with respect to the z direction. Therefore, a perimeter of the first layer 21 is larger than perimeters of the second layer 22 and the third layer 23, and a perimeter of the second layer 22 is larger than a perimeter of the third layer 23. In this case, a length of the first layer 21 in the x direction is also larger than a length of the third layer 23 in the x direction. Therefore, when coefficients of linear expansion of the layers satisfy a relationship of "coefficient of linear expansion of the first layer 21">"coefficient of linear expansion of the second layer 22">"coefficient of linear expansion of the third layer 23," a difference in coefficient of linear expansion of the layers can be reduced.

The magnetoresistance effect element 104 according to the fourth modified example differs only in a positional relationship of each component, and can obtain the same effects as those of the magnetoresistance effect element 100 according to the first embodiment. Also, since the side surface 28s is inclined with respect to the z direction, a surface area of the spin-orbit torque wiring 28 is increased, and heat dissipation is improved.

Second Embodiment

Figure 11:
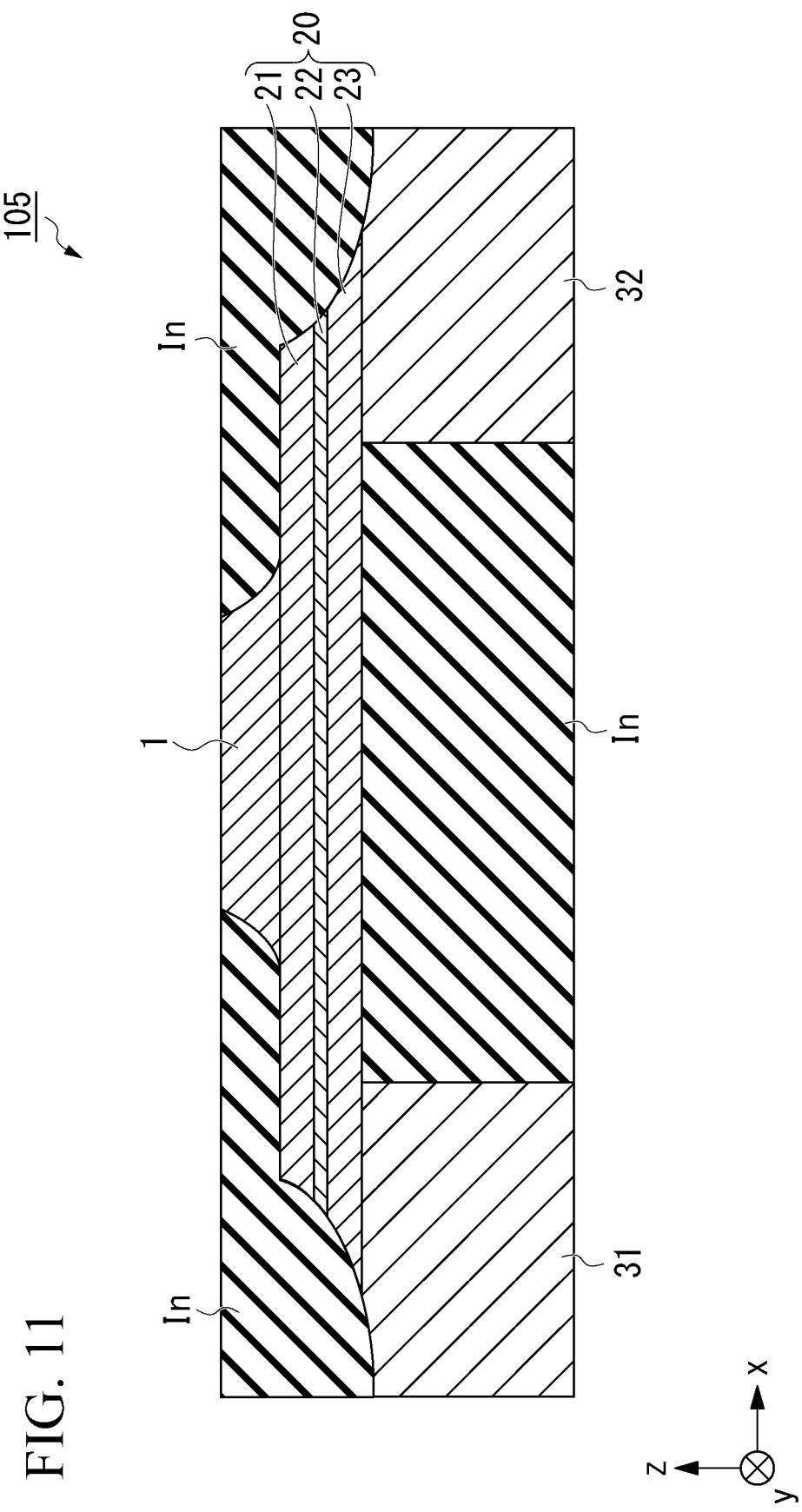
FIG. 11 is a cross-sectional view of a magnetization rotational element according to a second embodiment.

FIG. 11 is a cross-sectional view of a magnetization rotational element 105 according to a second embodiment. In FIG. 1, the magnetization rotational element 105 can be replaced with the magnetoresistance effect element 100 according to the first embodiment.

The magnetization rotational element 105, for example, causes light to be incident on a first ferromagnetic layer 1 and evaluates light reflected by the first ferromagnetic layer 1. When an orientation direction of magnetization changes due to a magnetic Kerr effect, a polarization state of the reflected light changes. The magnetization rotational element 105 can be used as, for example, an optical element such as a video display device utilizing, for example, a difference in polarization state of light.

In addition, the magnetization rotational element 105 can be used singly as an anisotropic magnetic sensor, as an optical element utilizing a magnetic Faraday effect, or the like.

A spin-orbit torque wiring 20 of the magnetization rotational element 105 includes a first layer 21, a second layer 22, and a third layer 23.

The magnetization rotational element 105 according to the second embodiment is one in which only the nonmagnetic layer 3 and the second ferromagnetic layer 2 are removed from the magnetoresistance effect element 100 according to the first embodiment, and can obtain the same effects as those of the magnetoresistance effect element 100.

As described above, preferred embodiments of the present invention have been exemplified on the basis of the first embodiment, the second embodiment, and the modified examples, but the present invention is not limited to these embodiments. For example, characteristic configurations in each of the embodiments and modified examples may be applied to other embodiments.

REFERENCE SIGNS LIST

1 First ferromagnetic layer
2 Second ferromagnetic layer
3 Nonmagnetic layer
10 Laminate
20, 26, 27, 28 Spin-orbit torque wiring
21 First layer
22, 22A Second layer
23 Third layer
24 Fourth layer
25 Fifth layer
31 First conductive layer
32 Second conductive layer
40 Fourth layer
100, 101, 102, 103, 104 Magnetoresistance effect element
105 Magnetization rotational element
200 Magnetic array
CL Common line
RL Read line
WL Write line

What is claimed is:

1. A magnetization rotational element comprising:
a spin-orbit torque wiring; and
a first ferromagnetic layer in contact with the spin-orbit torque wiring, wherein
the spin-orbit torque wiring includes a first layer, a second layer, and a third layer in order from a side closer to the first ferromagnetic layer, and
a coefficient of linear expansion of a material forming the second layer is between a coefficient of linear expansion of a material forming the first layer and a coefficient of linear expansion of a material forming the third layer.

2. The magnetization rotational element according to claim 1, wherein
the first layer contains a first element as a main element,
the second layer contains a second element different from the first element as a main element,
the third layer contains a third element different from the first element and the second element as a main element, and
a coefficient of linear expansion of the second element is between a coefficient of linear expansion of the first element and a coefficient of linear expansion of the third element.

3. The magnetization rotational element according to claim 2, wherein
the first layer contains a first element as a main element,
the second layer contains a second element different from the first element as a main element,
the third layer contains a third element different from the first element and the second element as a main element,
the first element and the third element are each any one of Au, Bi, Hf, Ir, Mo, Pd, Pt, Rh, Ru, Ta, W, Ag, Al, Cu, Ge, and Si, and
the second element is any one of Ag, Au, Bi, Co, Cr, Cu, Fe, Ge, Hf, Ir, Mo, Ni, Pd, Pt, Rh, Ru, and Ta.

4. The magnetization rotational element according to claim 3, wherein
the first element is any one of Au, Bi, Hf, Ir, Mo, Pd, Pt, Rh, Ru, Ta, and W,
the second element is any one of Ag, Au, Bi, Co, Cr, Cu, Fe, Ge, Hf, Ir, Mo, Ni, Pd, Pt, Rh, Ru, and Ta, and
the third element is any one of Ag, Al, Cu, Ge, and Si.

5. The magnetization rotational element according to claim 2, wherein
a perimeter of the first layer is smaller than perimeters of the second layer and the third layer, and
a perimeter of the second layer is smaller than a perimeter of the third layer.

6. The magnetization rotational element according to claim 2, wherein
a perimeter of the first layer is larger than perimeters of the second layer and the third layer, and
a perimeter of the second layer is larger than a perimeter of the third layer.

7. The magnetization rotational element according to claim 1, wherein
the first layer contains a first element as a main element,
the second layer contains a second element different from the first element as a main element,
the third layer contains a third element different from the first element and the second element as a main element,
the first element and the third element are each any one of Au, Bi, Hf, Ir, Mo, Pd, Pt, Rh, Ru, Ta, W, Ag, Al, Cu, Ge, and Si, and
the second element is any one of Ag, Au, Bi, Co, Cr, Cu, Fe, Ge, Hf, Ir, Mo, Ni, Pd, Pt, Rh, Ru, and Ta.

8. The magnetization rotational element according to claim 7, wherein
the first element is any one of Au, Bi, Hf, Ir, Mo, Pd, Pt, Rh, Ru, Ta, and W,
the second element is any one of Ag, Au, Bi, Co, Cr, Cu, Fe, Ge, Hf, Ir, Mo, Ni, Pd, Pt, Rh, Ru, and Ta, and
the third element is any one of Ag, Al, Cu, Ge, and Si.

9. The magnetization rotational element according to claim 8, wherein
a perimeter of the first layer is smaller than perimeters of the second layer and the third layer, and
a perimeter of the second layer is smaller than a perimeter of the third layer.

10. The magnetization rotational element according to claim 8, wherein
a perimeter of the first layer is larger than perimeters of the second layer and the third layer, and
a perimeter of the second layer is larger than a perimeter of the third layer.

11. The magnetization rotational element according to claim 7, wherein
a perimeter of the first layer is smaller than perimeters of the second layer and the third layer, and
a perimeter of the second layer is smaller than a perimeter of the third layer.

12. The magnetization rotational element according to claim 7, wherein
a perimeter of the first layer is larger than perimeters of the second layer and the third layer, and
a perimeter of the second layer is larger than a perimeter of the third layer.

13. The magnetization rotational element according to claim 1, wherein
a perimeter of the first layer is smaller than perimeters of the second layer and the third layer, and a perimeter of the second layer is smaller than a perimeter of the third layer.

14. The magnetization rotational element according to claim 1, wherein
a perimeter of the first layer is larger than perimeters of the second layer and the third layer, and
a perimeter of the second layer is larger than a perimeter of the third layer.

15. The magnetization rotational element according to claim 1, further comprising:
a fourth layer containing the same material as the second layer; and
a fifth layer containing the same material as the first layer or the third layer, wherein
the fourth layer is between the fifth layer and the third layer.

16. The magnetization rotational element according to claim 1, wherein
a film thickness of the second layer is smaller than film thicknesses of the first layer and the third layer.

17. The magnetization rotational element according to claim 1, wherein
the second layer is a continuous film having a plurality of openings or a layer including a plurality of constituent elements scattered in an island shape.

18. The magnetization rotational element according to claim 1, further comprising:
an intermediate layer in contact with the spin-orbit torque wiring; and
a conductive layer connected to the spin-orbit torque wiring through the intermediate layer, wherein
a coefficient of linear expansion of a material forming the intermediate layer is between a coefficient of linear expansion of a layer in contact with the intermediate layer and a coefficient of linear expansion of the conductive layer.

19. A magnetoresistance effect element comprising:
a magnetization rotational element according to claim 1;
a nonmagnetic layer in contact with the first ferromagnetic layer of the magnetization rotational element; and
a second ferromagnetic layer, together with the first ferromagnetic layer, sandwiching the nonmagnetic layer therebetween.

20. A magnetic memory comprising a plurality of magnetoresistance effect elements according to claim 19.

* * * * *